(12) United States Patent
Delmas

(10) Patent No.: US 6,731,681 B1
(45) Date of Patent: May 4, 2004

(54) METHOD FOR DETERMINING THE FREQUENCY INSTABILITY NOISE FROM A SOURCE AND A DEVICE FOR IMPLEMENTING THE METHOD

(75) Inventor: Christian Delmas, St Egreve (FR)

(73) Assignee: STMicroelectronics S.A., Gentilly (FR)

( * ) Notice: Subject to any disclaimer, the term of this patent is extended or adjusted under 35 U.S.C. 154(b) by 0 days.

(21) Appl. No.: 09/494,496

(22) Filed: Jan. 31, 2000

(51) Int. Cl.$^7$ .............................. H04B 1/20; G01S 7/40
(52) U.S. Cl. ........................................ 375/227; 324/616
(58) Field of Search .................................. 375/227, 376; 324/616; 327/21

(56) References Cited

U.S. PATENT DOCUMENTS

| | | | |
|---|---|---|---|
| 5,663,991 A | 9/1997 | Kelkar et al. ................ | 375/376 |
| 6,016,113 A | * 1/2000 | Binder ........................ | 341/131 |
| 6,114,858 A | * 9/2000 | Kasten ........................ | 324/616 |
| 6,298,118 B1 | * 10/2001 | Liggett ........................ | 379/21 |

FOREIGN PATENT DOCUMENTS

EP  0 889 411 A2  6/1998

OTHER PUBLICATIONS

Den Minren et al., "An 8 MM FM and AM Noise Measuring Equipment", International Microwave Symposium, Long Beach, Jun. 13–15, 1989, vols. 1–3 pp. 1179–1181.

"Circuit for Jitter Detection for Clock Signals", IBM Technical Disclosure Bulletin, vol. 39, No. 6, Jun. 1, 1996 pges. 243–245.

* cited by examiner

Primary Examiner—Stephen Chin
Assistant Examiner—Lawrence Williams
(74) Attorney, Agent, or Firm—Lisa K. Jorgenson; Allen, Dyer, Doppelt, Milbrath & Gilchrist, P.A.

(57) ABSTRACT

A method and device for measuring frequency instability noise $\Delta T_{RMS}$ from a source includes measuring the signal to noise ratio SRN1 at the output from a circuit having an input to receive a frequency input signal ft, an output to supply an output signal, and a sequencing input to receive a clock signal, and determining the signal to noise ratio SRN2 at the output from the circuit, the input signal being the frequency input signal ft and the clock signal being a signal coming from the source. The frequency instability noise $\Delta T_{RMS}$ is then calculated from SRN1, SRN2 and ft.

9 Claims, 1 Drawing Sheet

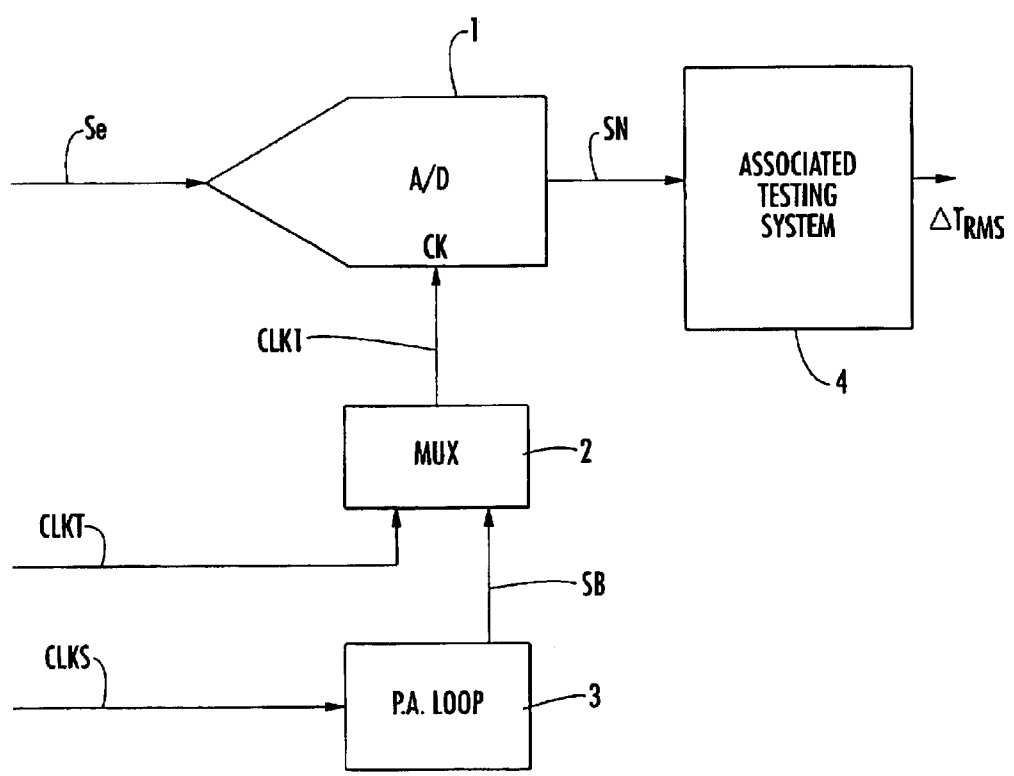

METHOD FOR DETERMINING THE FREQUENCY INSTABILITY NOISE FROM A SOURCE AND A DEVICE FOR IMPLEMENTING THE METHOD

FIELD OF THE INVENTION

The invention relates to the determination of frequency instability noise from a source and, more particularly, to a method and associated device for determining frequency instability noise from a phase alignment loop.

BACKGROUND OF THE INVENTION

According to the prior art, the measurement of frequency instability noise from a source, commonly called "jitter", is carried out by directly analyzing the signal supplied by the source. Two types of methods are commonly used.

A first method includes the direct measurement of the time jitter of the signal supplied by the source. An apparatus that allows time measurements is then used. In the case where the time jitter to be measured is of a low value (for example, of the order of a few tens of picoseconds), it is necessary to use a highly accurate measuring apparatus, which is therefore expensive. Additionally, it is also necessary to make a large number of measurements, which means that the total duration of the time jitter measurement is relatively long.

A second method includes using digital measurements of the output signal from the source using a purely digital tester. This type of measurement involves the processing of the large amount of data and, consequently, an overall test time which is long. Furthermore, the accuracy is limited by the resolution of the tester.

SUMMARY OF THE INVENTION

An object of the invention is to avoid the disadvantages mentioned above. Thus, the invention provides a method for measuring frequency instability noise from a source, including the following steps: a first step of measuring the signal to noise ratio SRN1 at the output from a circuit having an input to receive a frequency input signal ft, and an output to supply an output signal, and a sequencing input to receive a clock signal, the clock signal being a reference signal whose frequency instability noise level is less than the frequency instability noise level of the source; and a second step of determining the signal to noise ratio SRN2 at the output from the circuit, the input signal being the frequency input signal ft and the clock signal being a signal coming from the source. The method further includes a step of calculating the frequency instability noise $\Delta T_{RMS}$ from SRN1, SRN2 and ft so that:

$$\Delta T_{RMS} = \frac{\left(10^{\frac{-SNR2}{10}} - 10^{\frac{-SNR1}{10}}\right)^{\frac{1}{2}}}{2\Pi ft}$$

The invention also provides a device for measuring the frequency instability noise from a source supplying a signal. The measuring device includes a circuit having an input to receive an input signal, an output to supply an output signal and a sequencing input to receive the clock signal. The device also includes a multiplexer having a first input, a second input and an output, the first input being connected to a reference signal whose frequency instability noise level is less than the frequency instability noise level of the signal supplied by the source, the second input being connected to the signal supplied by the source and the output being connected to the sequencing input of the circuit.

According to the preferred embodiment of the invention, the output circuit from which the measurements of the signal to noise ratio are carried out is an analog/digital converter which receives at its input an analog signal of frequency ft and the source is a phase alignment loop.

Advantageously, the invention eliminates the necessity to directly measure the noise at the source output.

BRIEF DESCRIPTION OF THE DRAWING

Other characteristics and advantages of the invention will become apparent on reading a preferred embodiment of the invention described below while referring to the appended figure.

The FIGURE shows a device for measuring the frequency instability noise in accordance with the preferred embodiment of the invention.

DETAILED DESCRIPTION OF THE PREFERRED EMBODIMENTS

The device comprises an analog/digital converter 1, a multiplexer 2 and a phase alignment loop 3. The analog/digital converter 1 receives at its input a signal Se of frequency ft such that Se=A sin(2πft t). The analog/digital converter 1 comprises a clock input CK connected to the output of the multiplexer 2, the first input of which is connected to a reference signal CLKT and a second input of which is connected to the signal SE coming from the phase alignment loop 3 which has a signal CLKS as its input signal.

The method for measuring frequency instability noise of the output signal from the phase alignment loop 3 comprises two steps of measuring the signal to noise ratio at the output from circuit 1. According to a first step, the signal CLK1 coming from the multiplexer 2 is the signal CLKT. The measured signal to noise ratio is then written as:

$$SNR1 = 20 \times \log[A/(2(Ba^2 + Bj1^2))^{1/2}];$$

where Ba is the quantization noise of the analog/digital converter 1, Bj1 is the frequency instability noise from circuit 1 and from the associated testing system 4.

According to a second step, the signal CLK1 from the multiplexer 2 is the signal SB from the phase alignment loop 3. The measured signal to noise ratio is then written as:

$$SNR2 = 20 \times \log[A/(2(Ba^2 + Bj1^2 + Bj2^2))^{1/2}];$$

where Bj2 is the frequency instability noise from the phase alignment loop 3. It therefore follows that:

$$Bj2 = A \times \frac{\left(10^{\frac{-SNR2}{10}} - 10^{\frac{-SNR1}{10}}\right)^{\frac{1}{2}}}{2\Pi ft}$$

Furthermore, as would be appreciated by those skilled in the art, the noise Bj2 can be written:

$$Bj2 = A \times (2)^{1/2} \times \pi \times ft \times \Delta T_{RMS};$$

where $\Delta T_{RMS}$ is the Root Mean Square (RMS) noise from the source. As would also be recognized by the skilled artisan, the RMS noise is the moment of order 2 of the variable random "noise" or standard deviation.

It therefore follows that:

$$\Delta T_{\text{RMS}} = \frac{\left(10^{\frac{-SNR2}{10}} - 10^{\frac{-SNR1}{10}}\right)^{\frac{1}{2}}}{2\Pi ft}$$

The measurement of the frequency instability noise from the source is carried out in accordance with the principle of differential measurements. It follows that the result of the measurement is highly accurate.

The invention can be implemented under coherent test conditions, i.e. for ft/fs=m/n where fs is the frequency of the clock signal and m and n are two integers mutually nearest neighbors to one another, m being smaller than n. One advantage of the invention is that it can also be implemented under incoherent test conditions, i.e. in the case where the frequencies ft and fs are not in a favored ratio.

The invention is applicable to the case where the analog/digital converter and the multiplexer are elements of a test device designed exclusively to carry out the measurement of the frequency instability noise from a phase alignment loop.

Furthermore, in numerous devices such as, for example, mixed VLS1 devices, a phase alignment loop is used to supply the clock signal which is applied to an analog/digital converter. Hence, the invention is also concerned with the measurement of the frequency instability of a phase alignment loop under these conditions. Advantageously it is then possible to test the frequency instability noise from the phase alignment loop through the analog/digital converter which is connected to it within one and the same device.

According to the preferred embodiment of the invention, the output circuit whose signal to noise ratio is measured is an analog/digital converter and the signal whose frequency instability noise is measured is applied to the clock input of the analog/digital converter.

In a more general way, the invention relates to the case where the output circuit whose signal to noise ratio is measured is a circuit of the type having a sequencing input, the signal whose frequency instability noise is measured being applied to the sequencing input. Hence, the invention also relates to a digital/analog converter having a clock input to which is applied the signal whose instability noise is to be measured.

What is claimed is:

1. A method for determining frequency instability noise $\Delta T_{RMS}$ of a source, comprising the steps of:
    determining a signal to noise ratio SNR1 at an output of an analog/digital converter having an input for receiving a frequency input signal ft, an output for supplying an output signal, and a sequencing input for receiving a clock signal, the clock signal being a reference signal having a frequency instability noise level which is lower than a level of frequency instability noise from the source;
    determining a signal to noise ratio SNR2 at the output from an analog/digital converter, the clock signal being a signal from the source; and
    calculating the frequency instability noise $\Delta T_{RMS}$ from SNR1, SNR2 and ft so that:

$$\Delta T_{\text{RMS}} = \frac{\left(10^{\frac{-SNR2}{10}} - 10^{\frac{-SNR1}{10}}\right)^{\frac{1}{2}}}{2\Pi ft}.$$

2. A method according to claim 1, wherein the source is a phase alignment loop.

3. A method for determining frequency instability noise of a source, comprising the steps of:
    providing an input signal having a frequency to an input of a circuit;
    providing a reference signal, having a frequency instability noise level which is lower than a level of frequency instability noise from the source, as a clock signal at a sequencing input of the circuit;
    outputting an output signal from the circuit;
    determining a first signal to noise ratio of the output signal;
    providing a signal from the source as the clock signal at the sequencing input of the circuit;
    determining a second signal to noise ratio of the output signal; and
    calculating the frequency instability noise from the first signal to noise ratio, the second signal to noise ratio and the frequency of the input signal.

4. A method according to claim 3, wherein the step of calculating the frequency instability noise comprises:

$$\Delta T_{\text{RMS}} = \frac{\left(10^{\frac{-SNR2}{10}} - 10^{\frac{-SNR1}{10}}\right)^{\frac{1}{2}}}{2\Pi ft}$$

where $\Delta T_{RMS}$ is the frequency instability noise, SNR1 is the first signal to noise ratio, SNR2 is the second signal to noise ratio and ft is the frequency of the input signal.

5. A method according to claim 3, wherein the source is a phase alignment loop.

6. A method according to claim 3, wherein the circuit is an analog/digital converter.

7. A method according to claim 3, wherein the circuit is a digital/analog converter.

8. A device for determining frequency instability noise $\Delta T_{RMS}$ of a signal supplied by a source, the device comprising;
    an analog/digital converter having an input for receiving an input signal having a frequency ft, an output for supplying an output signal and a sequencing input for receiving a clock signal;
    a multiplexer having a first input for receiving a reference signal having a frequency instability noise level which is lower than the frequency instability noise level of the signal supplied by the source, a second input for receiving the signal supplied by the source and an output connected to the sequencing input of the analog/digital converter; and
    an associated testing system for determining a first signal to noise ratio SNR1 at an output of the analog/digital converter when the reference signal is received at the sequencing input, for determining a second signal to noise ratio SNR2 at the output from the analog/digital converter when the signal supplied by the source is received at the sequencing input, and for calculating the frequency instability noise $\Delta T_{RMS}$ from SNR1, SNR2 and ft so that:

$$\Delta T_{\text{RMS}} = \frac{\left(10^{\frac{-SNR2}{10}} - 10^{\frac{-SNR1}{10}}\right)^{\frac{1}{2}}}{2\Pi ft}.$$

9. A device according to claim 8, wherein the source comprises a phase alignment loop.

* * * * *